United States Patent
Sevens et al.

(10) Patent No.: US 6,885,853 B2
(45) Date of Patent: Apr. 26, 2005

(54) COMMUNICATIONS RECEIVER WITH INTEGRATED IF FILTER AND METHOD THEREFOR

(75) Inventors: Kazim Sevens, San Jose, CA (US); Majid M. Hashemi, San Jose, CA (US); Ismail H. Ozguc, Sunnyvale, CA (US)

(73) Assignee: National Scientific Corporation, Scottsdale, AZ (US)

( * ) Notice: Subject to any disclaimer, the term of this patent is extended or adjusted under 35 U.S.C. 154(b) by 722 days.

(21) Appl. No.: 09/833,438

(22) Filed: Apr. 11, 2001

(65) Prior Publication Data

US 2002/0151292 A1 Oct. 17, 2002

(51) Int. Cl.[7] .................................................. H04B 1/06
(52) U.S. Cl. ................ 455/255; 455/182.2; 455/192.2; 455/333
(58) Field of Search ................................ 455/254, 255, 455/257, 258, 260, 265, 266, 182.2, 192.2, 333, 316

(56) References Cited

U.S. PATENT DOCUMENTS

| | | |
|---|---|---|
| 3,894,286 A | 7/1975 | Armstrong |
| 4,193,686 A | 3/1980 | Klank |
| 5,281,931 A | 1/1994 | Bailey et al. |
| 5,404,589 A | 4/1995 | Bijker et al. |
| 5,408,196 A * | 4/1995 | Sempel et al. ............... 329/325 |
| 5,487,186 A * | 1/1996 | Scarpa ..................... 455/192.2 |
| 5,564,099 A | 10/1996 | Yonekura et al. |
| 5,621,355 A | 4/1997 | Williams et al. |
| 5,758,296 A | 5/1998 | Nakamura |
| 5,937,013 A | 8/1999 | Lam et al. |
| 6,167,246 A | 12/2000 | Elder et al. |

OTHER PUBLICATIONS

Ajjikuttira, et al "A Fully–Integrated CMOS RFIC for Bluetooth Applications" 2001 IEEE International Solid-State Circuits Conference, pp 198–199, 2001.

Filiol, et a;. "A 22mW Blutooth RF Transceiver with Direct RF Modulation and On–Chip IF Filtering" 2001 IEEE International Solid–State Circuits Conference, pp. 202–203, 2001.

Johns & Martin "Analog Intergrated Circuit Design" Chapter 15, pp. 574–575, 578–584 & 626–635, Published by John Wiley & Sons, Inc., 1996.

* cited by examiner

*Primary Examiner*—Lee Nguyen
(74) *Attorney, Agent, or Firm*—Lowell W. Gresham; Jordan M. Meschkow; Meschkow & Gresham, P.C.

(57) ABSTRACT

A receiver (22) includes an IF filter (44) and a nearby process-variant circuit (80) formed on a common semiconductor substrate (24). The actual center frequency of the IF filter (44) is determined by resistors (70, 74) and capacitors (72, 76) exhibiting imprecise values and is unlikely to equal a nominal center frequency. The process-variant circuit (80) includes a test resistor (102) and test capacitor (104) formed using the same resistor-forming and capacitor-forming processes used to form the IF filter resistors (70, 74) and capacitors (72, 76). In response a test signal (88) from the process-variant circuit (80) and a reference signal (84) from a process-invariant circuit (82), a tuning parameter for a tunable local oscillator (90) is determined so that a local oscillation signal (94) will exhibit a frequency which, when mixed with an RF signal (38) yields an IF signal (42) at the actual center frequency of the IF filter (44).

18 Claims, 4 Drawing Sheets

COMMUNICATIONS RECEIVER WITH INTEGRATED IF FILTER AND METHOD THEREFOR

TECHNICAL FIELD OF THE INVENTION

The present invention relates generally to the field of radio-frequency (RF) communication receivers. More specifically, the present invention relates to RF receivers having on-chip intermediate frequency (IF) filters.

BACKGROUND OF THE INVENTION

A continuing need exists for lower power, less expensive, and physically smaller wireless devices to meet existing and future demands of portable and other electronic communications. Such demands are particularly prominent in cellular telephone, paging, wireless modem, and other applications. Traditionally, receivers have used a superheterodyne architecture that achieves acceptable results but requires a mixture of on-chip components with an excessive number of off-chip components. The use of off-chip components is particularly undesirable for several reasons since off-chip components make such architectures larger, consume more power, less likely to maintain precise tuning, and more expensive than desired. In an attempt to address these concerns, direct conversion and low-IF receiver architectures have become more popular, with more and more electronic functions being performed on-chip.

One particularly challenging receiver component to integrate on-chip with other components has been the IF filter. The IF filter is typically a bandpass filter which resides downstream of an RF downconversion mixer and upstream of demodulation and baseband processing. Conventionally, local oscillators which drive downconversion mixers are designed and/or tuned so that the downconversion mixer generates a constant, fixed IF frequency regardless of the RF frequency channel being received. Often the IF filter is a bulky component or collection of components that exhibit this same constant, fixed center frequency and are located off-chip. One of the tasks a receiver designer must then perform is to select sufficiently accurate components or otherwise tune components so that the IF filter precisely exhibits a center frequency equal to the fixed IF frequency. If an IF filter exhibits a center frequency that does not closely match the fixed IF frequency, then signal-to-noise decrease and other signal deterioration effects result.

When the IF filter is implemented on-chip using conventional semiconductor formation processes, the resulting resistors, capacitors, and other analog component values often exhibit large variations over temperature, within a single die and wafer, and between different semiconductor batches. Actual resistive and/or capacitive values twenty percent greater than or less than their nominal values are not unusual. In many receiver applications, this variation in component values leads to an unacceptably imprecise IF filter center frequency, which exhibits too much variation over temperature and between different semiconductor dice, wafers, and batches.

Of course, conventional semiconductor processing techniques can also form passive analog components with lower tolerance values, but the consequences of achieving the lower tolerance values may themselves be undesirable. For example, a resistor having a given nominal resistance value may be implemented in a larger die area with greater precision by using relatively high doping, or in a smaller die area with less precision by using relatively low doping. However, the use of a greater die area to obtain a greater precision is undesirable because it leads to a more expensive product and otherwise consumes precious die area that may be better used for other functions.

Some conventional receivers address the imprecise on-chip IF filter center frequency problem by designing tunable IF filters. Unfortunately, the implementation of an on-chip tunable IF filter is itself undesirable. For example, a switched-capacitor filter design may be capable of achieving sufficient center frequency precision, but the high speed clock and switching noise which characterize this filter design make it unsuitable for many receiver applications. Continuous time filtering (e.g., $g_m$-C filters) may also be capable of achieving sufficient center frequency precision, but the needed precision requires complex filter-tuning circuitry which increases power consumption and uses precious semiconductor die area that can be better used for other functions.

SUMMARY OF THE INVENTION

It is an advantage of the present invention that an improved communications receiver having an integrated intermediate frequency (IF) filter is provided along with a method for operating a communications receiver having an integrated IF filter.

Another advantage of the present invention is that low power and a small chip die area are used by an RF receiver that has a non-tunable, on-chip IF filter.

Another advantage of the present invention is that a process-variant circuit is used to estimate an actual center frequency of a substantially non-tunable on-chip IF filter, then a tunable local oscillator is controlled so that an IF signal approximately equals the actual center frequency of the IF filter.

These and other advantages are realized in one form by an improved method of tuning an RF receiver to a desired frequency channel. The RF receiver has a common semiconductor substrate on which an intermediate frequency filter and a process-variant test circuit are formed. The method includes operating the process-variant test circuit to estimate an actual center frequency of the intermediate frequency filter. A tuning parameter is formed in response to the estimated actual center frequency and the desired frequency channel. The tuning parameter is applied to a tunable local oscillator which generates a local oscillator signal that, when mixed in a downconversion mixer with an RF signal from the desired frequency channel, generates an IF signal exhibiting approximately the actual center frequency of the IF filter.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
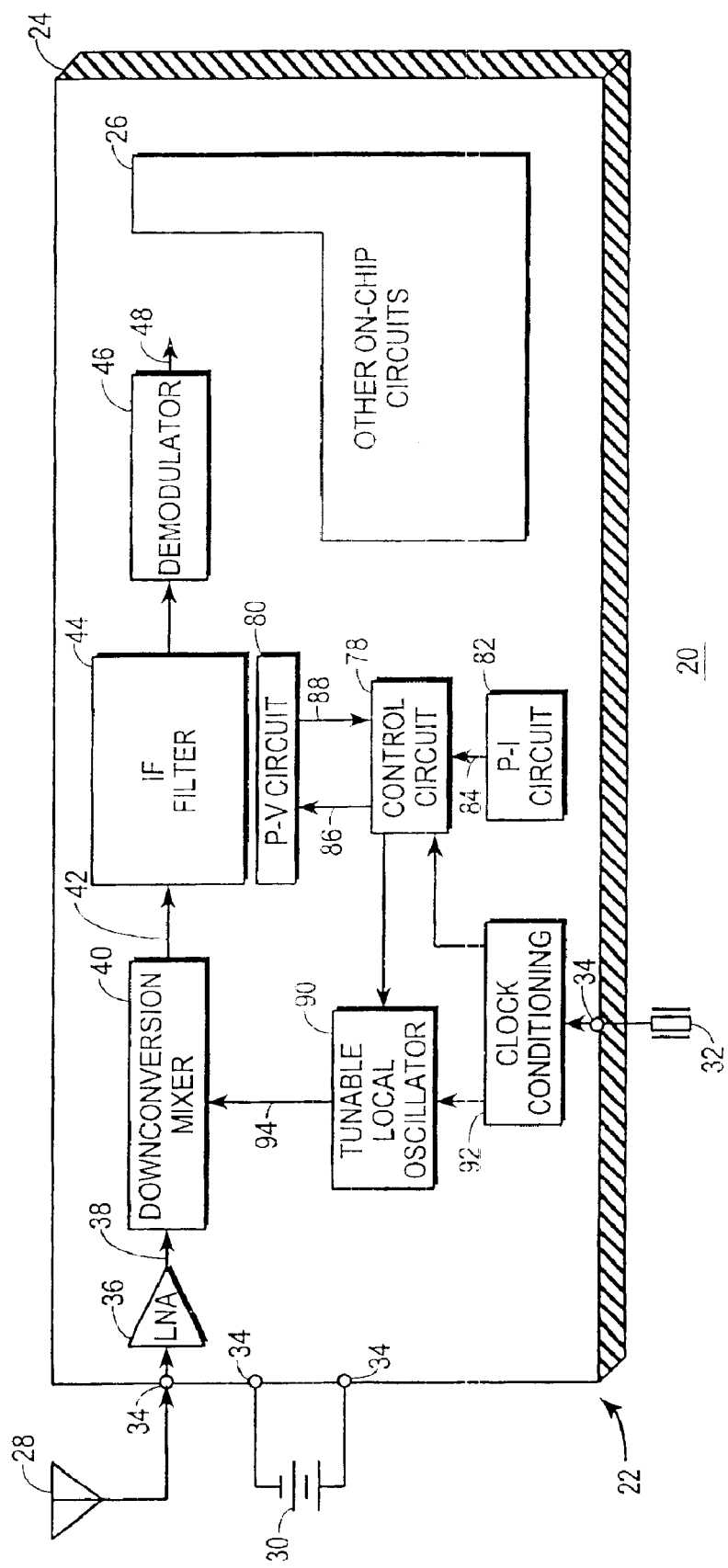
FIG. 1 shows a block diagram of a communications device which includes an RF receiver configured in accordance with the teaching of the present invention.

FIG. 1 shows a block diagram of a communications device 20 configured in accordance with the teaching of the present invention. Communications device 20 includes a radio-frequency (RF) receiver 22, which desirably has a highly integrated architecture with a majority of the receiver components being formed on a common semiconductor substrate 24. In addition to receiver 22, communications device 20 may include other circuits 26 formed on substrate 24. Other circuits 26 may include a modulator/transmitter, baseband processing circuits, and the like. Portable communications devices, such as wireless modems, cordless telephones, pagers, cellular telephones, radios, and the like, may benefit from communications device 20 due to its low power consumption and minimal requirements for implementation space, including semiconductor die area. However, communications device 20 is not limited to use in portable applications.

An antenna 28, a power source 30, and a crystal 32 couple to contacts 34 formed on substrate 24. Antenna 28 supplies a received RF signal to receiver 22. Power source 30 provides electrical energy which, when applied, activates the various components formed on substrate 24. FIG. 1 omits illustration of interconnects between the components and the contacts 34 for power source 30 for the sake of clarity. The components which are used by receiver 22 are discussed below. Crystal 32 allows communication device 20 to form a stable clock or other timing reference signal in a manner well understood by those skilled in the art.

On substrate 24, contact 34 for antenna 28 couples to an input of a low noise amplifier (LNA) 36. An output of LNA 36 supplies an RF signal 38 and couples to a first input of a downconversion mixer 40. In the preferred embodiment, downconversion mixer 40 is desirably an image-reject mixer, but other types of mixers may be used as well, perhaps with an appropriate image filter (not shown). An output of mixer 40 supplies an IF signal 42 and couples to an input of an intermediate frequency (IF) filter 44. An output of IF filter 44 couples to an input of a demodulator 46, perhaps through a limiting amplifier (not shown). An output of demodulator 46 provides a baseband signal 48 that may be routed off-chip or to other circuits 26.

In order to reduce power consumption and area requirements on substrate 24, IF filter 44 is desirably configured as a non-tunable filter. In other words, while bandwidth and center frequency parameters of IF filter 40 may vary due to process variations and temperature, no signals are provided to tune these parameters to desired values while IF filter 44 is activated. In the preferred embodiment, IF filter 44 is designed so that it exhibits a nominal center frequency high enough to accommodate the baseband signal bandwidth, to benefit from reduced 1/f noise, and to manage image rejection, but otherwise as low as possible to reduce power consumption and ease digital conversions that may take place downstream. In this one preferred embodiment, a nominal 2 MHz center frequency for IF filter 44 achieves these goals. However, as discussed below in more detail, the actual center frequency for IF filter 44 need not precisely equal 2 MHz but may easily be ±10% or more away from the nominal value.

Figure 2:
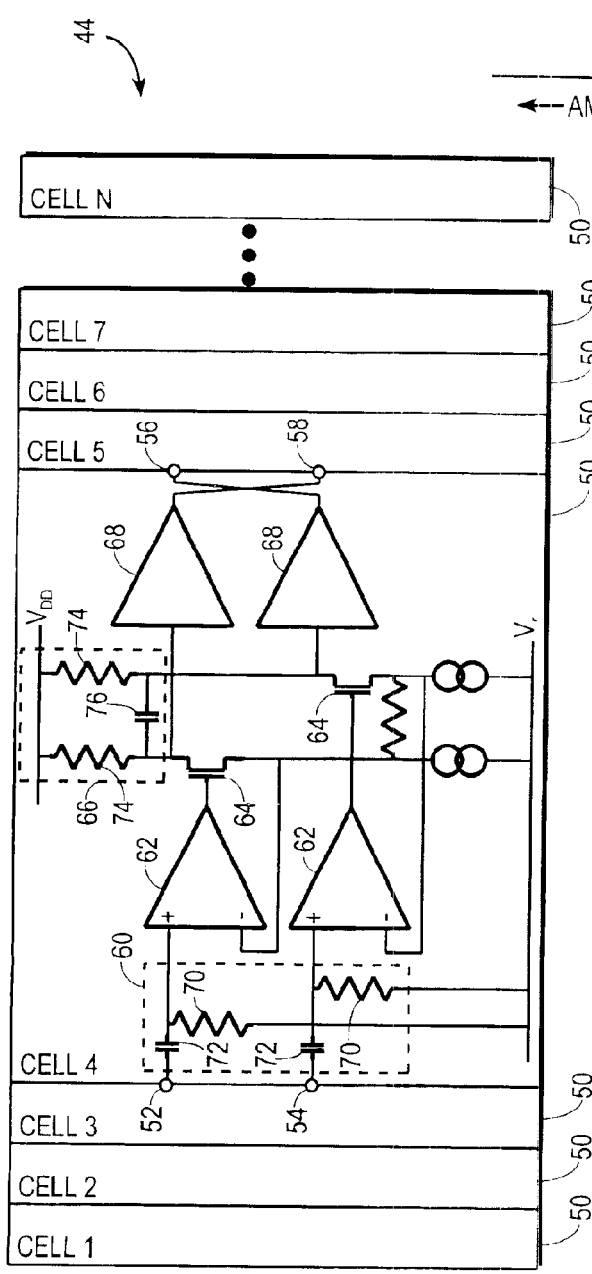
FIG. 2 shows a schematic diagram of an on-chip IF filter formed as part of the receiver in accordance with the teaching of the present invention.

FIG. 2 shows a schematic diagram of one on-chip IF filter 44 formed on semiconductor substrate 24 as a part of receiver 22 in accordance with the teaching of the present invention. IF filter 44 is a simple, non-tunable design which requires significantly less die area to implement and consumes less power than a tunable filter. IF filter 44 includes a plurality of cells 50 arranged in series. FIG. 2 illustrates cells 50 as being cascaded from cell 1 to cell N, where N may be any number but is desirably around twenty-four in the preferred embodiment.

Each of cells 50 may be configured similarly to the others. As illustrated in the cell 50 labeled "CELL 4," each cell has a positive input terminal 52, a negative input terminal 54, a positive output terminal 56, and a negative output terminal 58. The positive and negative output terminals 56 and 58 of one cell 50 respectively serve as the positive and negative input terminals 52 and 54 for the subsequent cell 50. Input terminals 52 and 54 couple through a high pass filter section 60 and input buffers 62 to intermediate devices 64. Intermediate devices 64 couple to a low pass filter section 66 and output buffers 68. Output buffers 68 couple to output terminals 56 and 58. High pass filter section 60 includes two resistors 70 and two capacitors 72. Low pass filter section 66 includes two resistors 74 and one capacitor 76. Resistance and capacitance values for resistors 70 and 74 and for capacitors 72 and 76 are selected by a designer in a manner well-understood to those skilled in the art so that a band pass filter results having a pass band which narrowly accommodates the bandwidth of baseband signal 4B (FIG. 1) and a desired nominal center frequency, e.g., the 2 MHz IF frequency for IF signal 42 (FIG. 1) discussed above. The nominal values are the ones that a designer specifies which will cause the desired result. However, the nominal values specified by a designer are not always achieved in practice.

Those skilled in the art will appreciate that a number of semiconductor formation processes are performed in forming the various components included in IF filter 44. Semiconductor device-forming processes are performed to form transistors, diodes, and the like, which are the primary type of component in buffers 62 and 68 and in intermediate devices 64. A resistor-forming process is performed in forming resistors 70 and 74, and a capacitor-forming process is performed in forming capacitors 72 and 76. An interconnect-forming process may also be performed to form interconnects among various ones of the components. Of course, nothing prevents the tasks from one of these processes from being integrated with tasks from other ones of these processes. The present invention contemplates the use of conventional ones of these processes, with the preferred embodiment being implemented in CMOS. However, the spirit of the present invention applies to other types of semiconductors as well. For example, a conventional polysilicon or diffusion process may be used as a resistor-forming process, and a conventional poly—poly or metalinsulator-metal (MIM) process may be used as a capacitor-forming process.

Some of these formation processes are more prone to variation than other ones of the processes. For example, it is not unusual to see 20% variation in resistance values over temperature, and at different locations on a die, wafer or between batches using a conventional resistor-forming process in which the resistor occupies a reasonable amount of die area. Likewise, it is not unusual to see 10% variation in capacitance values over temperature, and at different locations on a die, wafer or between batches using a conventional capacitor-forming process. Accordingly, the actual center frequency of IF filter 44 is likely to vary from the nominal center frequency.

Figure 3:
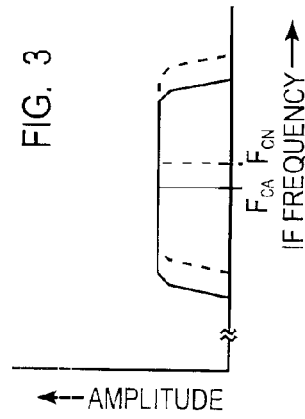
FIG. 3 shows a spectrum diagram of actual and nominal pass bands of the IF filter depicted in FIG. 2.

FIG. 3 shows a spectrum diagram of actual and nominal pass bands of IF filter 44. FIG. 3 depicts a nominal pass band having a nominal center frequency $F_{CN}$ as a dotted line and an actual pass band having an actual center frequency $F_{CA}$ as a solid line. While FIG. 3 depicts actual center frequency $F_{CA}$ as being displaced downward in frequency from nominal center frequency $F_{CN}$, in any given communication device 20 (FIG. 1) at any given time, actual center frequency $F_{CA}$ might alternatively be displaced upward in frequency from nominal center frequency $F_{CN}$.

Referring back to FIG. 1, a control circuit 78, a process-variant (P-V) circuit 80, and a process-invariant (P-I) circuit 82 cooperate, to compensate for the offset between actual center frequency $F_{CA}$ and nominal center frequency $F_{CN}$ (FIG. 3) of IF filter 44. Process-invariant circuit 82 has an output that supplies a reference signal 84, control circuit 78 has an output that supplies a control signal 86, and process-variant circuit 80 has an output that supplies a test signal 88. The reference signal 84 output of process-invariant circuit 82 couples to an input of control circuit 78, the control signal 86 output of control circuit 78 couples to an input of process-variant circuit 80, and the test signal 88 output of process-variant circuit 80 couples to an input of control circuit 78.

Another output of control circuit 78 couples to a control input of a tunable local oscillator 90, and an output of tunable local oscillator 90 couples to a second input of downconversion mixer 40. A clock conditioning circuit 92 couples to the contact 34 for crystal 32, and has outputs that couple to inputs of control circuit 78 and tunable local oscillator 90. Clock conditioning circuit 92 provides one or more stable clock and oscillation signals to the various components of communications device 20, including control circuit 78 and tunable local oscillator 90. Tunable local oscillator 90 provides a local oscillation signal 94 which is offset in frequency from the RF signal 38 by an amount which establishes the frequency of IF signal 42, as is well understood by those skilled in the art. In the preferred embodiment, tunable local oscillator 90 performs direct digital synthesis of its output signal. However, other types of synthesizers and numerically controlled or voltage controlled oscillators may likewise be adapted for use as tunable local oscillator 90. As illustrated in FIG. 1, each of LNA 36, downconversion mixer 40, IF filter 44, demodulator 46, process-variant circuit 80, control circuit 78, process-invariant circuit 82, clock conditioning circuit 92, and tunable local oscillator 90 is desirably formed on common semiconductor substrate 24.

Process-variant circuit 80 includes components, such as a resistor and capacitor, that are formed using the same resistor-forming and capacitor-forming processes used to form resistors 70 and 74 and capacitors 72 and 76 (FIG. 2), which are primarily responsible for establishing the center frequency of IF filter 44. The use of the same processes does not require the same resistive and capacitive values, but desirably the same materials, thicknesses, temperatures, levels, dopant diffusion parameters, and the like are used to form process-variant circuit 80 at the same time that resistors 70 and 74 and capacitors 72 and 76 are formed. Moreover, process-variant circuit 80 is desirably located proximate, as illustrated in FIG. 1, and preferably as near as possible or even interdigitated with IF filter 44. The proximate location of process-variant circuit 80 to IF filter 44 minimizes inter-die process and/or temperature variations experienced between IF filter 44 and process-variant circuit 80. Accordingly, the same process variations that cause IF filter 44 to exhibit an actual center frequency $F_{CA}$ that may widely differ from nominal center frequency $F_{CN}$ (FIG. 3) affect process-variant circuit 80, and process-variant circuit 80 tracks process and temperature variations that affect IF filter 44.

On the other hand, process-invariant circuit 82 is configured so that reference signal 84 is substantially unaffected by variations in the resistor-forming and capacitor-forming processes used to form IF filter 44 and process-variant circuit 80. Those skilled in the art will appreciate that process-invariant circuit 82 need not be absolutely invariant to semiconductor formation processing. Rather, process-invariant circuit 82 is simply as invariant as practical in comparison to process-variant circuit 80.

Generally speaking, control circuit 78 monitors test signal 88 supplied by process-variant circuit 80 and reference signal 84 supplied by process-invariant circuit 82 to estimate the actual center frequency $F_{CA}$ of IF filter 44. Based on this estimate, control circuit 78 determines a tuning parameter that control circuit 78 applies to tunable local oscillator 90. This tuning parameter is configured so that the resulting local oscillator signal 94, when mixed with RF signal 38 at a predetermined frequency, generates IF signal 42 to exhibit approximately the actual center frequency $F_{CA}$ of IF filter 44. In other words, control circuit 78 adjusts the tuning parameter so that local oscillator signal 94 does not exhibit its nominal value which would cause IF signal 42 to exhibit a fixed, nominal center frequency $F_{CN}$ of IF filter 44. But control circuit 78 does exhibit a variable value as needed to causes IF signal 42 vary and exhibit the actual center frequency $F_{CA}$ of IF filter 44.

Figure 4:
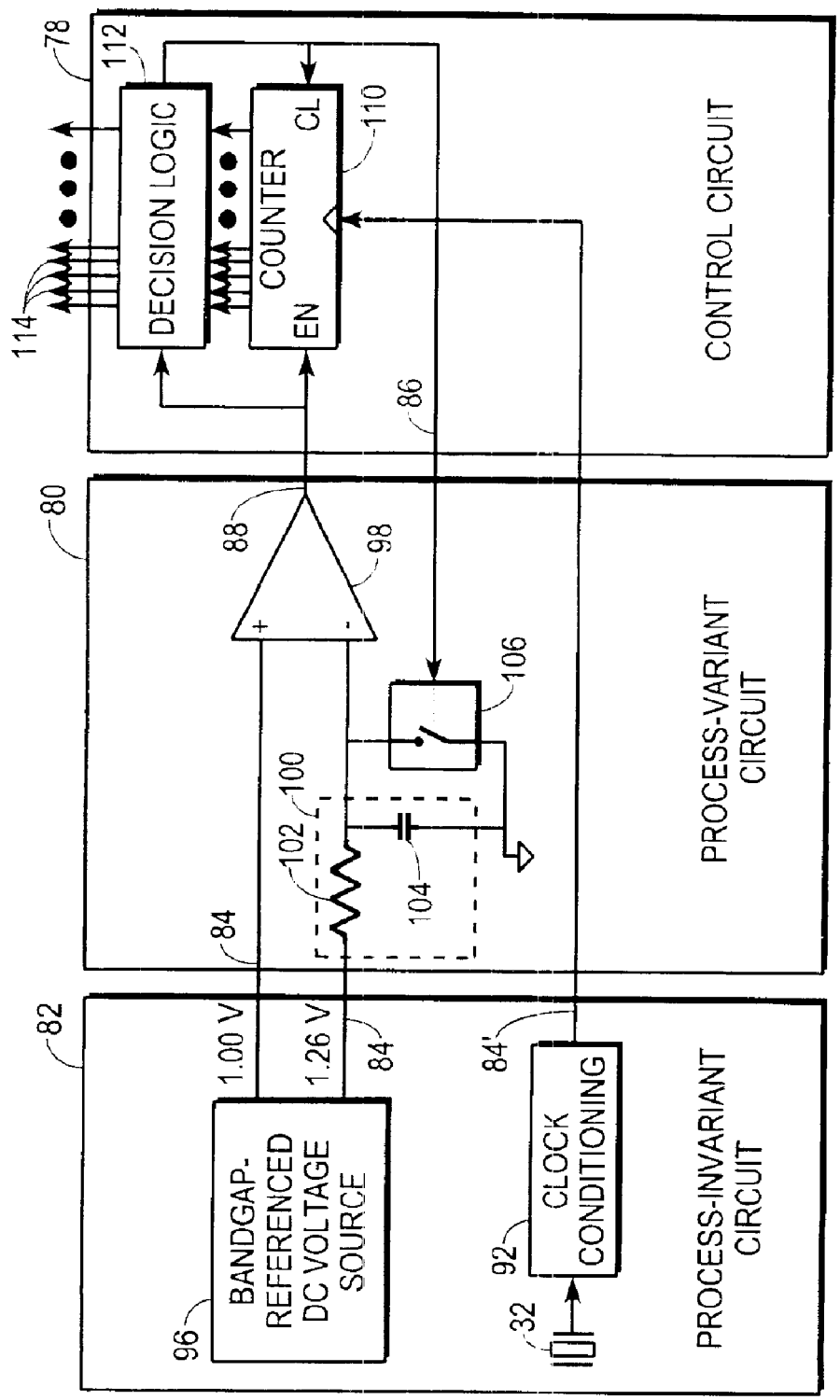
FIG. 4 shows a block diagram of a process-invariant circuit, a process-variant circuit, and a control circuit of the RF receiver depicted in FIG. 1.

FIG. 4 shows a block diagram depicting further details of an exemplary embodiment of process-invariant circuit 82, process-variant circuit 80, and control circuit 78 of RF receiver 22. Process-invariant circuit 82 includes a bandgap-referenced DC voltage source 96 configured to provide 1.26 and 1.00 volt outputs, which collectively serve as reference signal 84. Conventional techniques may be used to provide these voltages. Those skilled in the art will appreciate that a bandgap-referenced voltage source is reasonably invariant to process and temperature variations because it is based upon the bandgap voltage of the semiconductor material from which it is formed, i.e., 1.26 V in silicon.

FIG. 4 depicts crystal 32 and clock conditioning circuit 92 as included in process-invariant circuit 82. Since crystal 32 is not formed on semiconductor substrate 24 (FIG. 1), it is substantially invariant to semiconductor processing variation. Likewise, the portion of clock conditioning circuit 92 included in process-invariant circuit 82 may be substantially a digital circuit which is formed primarily of semiconductor devices rather than passive analog components and is substantially immune to the types of process variations discussed above. Consequently, a reference clock signal 84' supplied by clock conditioning circuit 92 and process-invariant circuit 82 can provide a substantially stable time base. In the preferred embodiment, clock conditioning circuit 92 divides a higher frequency clock signal to achieve a more desirable clock speed for noise reduction and minimal power consumption purposes, such as 1 MHz. Of course, any convenient frequency which may be usable in other components of communication device 20 may be used for reference clock signal 84'.

The 1.26 and 1.00 volt reference signals 84 of this exemplary embodiment are supplied to process-variant circuit 80. The lower 1.00 V reference signal is supplied to a positive input of a comparator 98, and the higher 1.26 V reference signal is supplied through a low pass filter 100 to a negative input of comparator 98. An output of comparator 98 provides test signal 88. Low pass filter 100 includes an in-series test resistor 102 and a test capacitor 104 coupled between the negative input of comparator 98 and a common reference voltage, such as ground. Test resistor 102 is formed using the same resistor-forming process used to form resistors 70 and 74 of IF filter 44 (FIG. 2), and test capacitor 104 is formed using the same capacitor-forming process used to form capacitors 72 and 76 of IF filter 44 (FIG. 2). Comparator 98 is formed primarily using the semiconductor device-forming process. Accordingly, test resistor 102 and test capacitor 104 tend to experience the same process and temperature variations experienced by IF filter 44. A switching device 106 couples across capacitor 104.

Control circuit 78 includes a digital counter 110 having an enable (EN) input adapted to receive test signal 88 from comparator 98 of process-variant circuit 80 and a clock input adapted to receive reference clock signal 84' from process-invariant circuit 82. Counter 110 is enabled to count oscillations of reference clock signal 84' when the voltage at the negative input of comparator 98 is less than the 1.00 V reference signal 84 and prohibited from counting when the voltage at the negative input of comparator 98 is greater than the 1.00 V reference signal 84. Outputs from counter 110 couple to inputs of a decision logic circuit 112, and control output signal 86 from decision logic circuit 112 couples to a clear (CL) input of counter 110 and to a control input of switching device 106 in process-variant circuit 80. The test signal 88 output of comparator 98 also couples to an input of decision logic circuit 112.

Switching device 106 and counter 110 are configured so that counter 110 is held in a reset, cleared, or otherwise initialized state and switching device 106 is closed when control output signal 86 exhibits a first state, and counter 110 is allowed to count from the initialized state and switching device 106 is open when control output signal 86 exhibits a second state. The above-discussed tuning parameter is provided at a tuning output 114 for application to tunable local oscillator 90 (FIG. 1).

Figure 5:
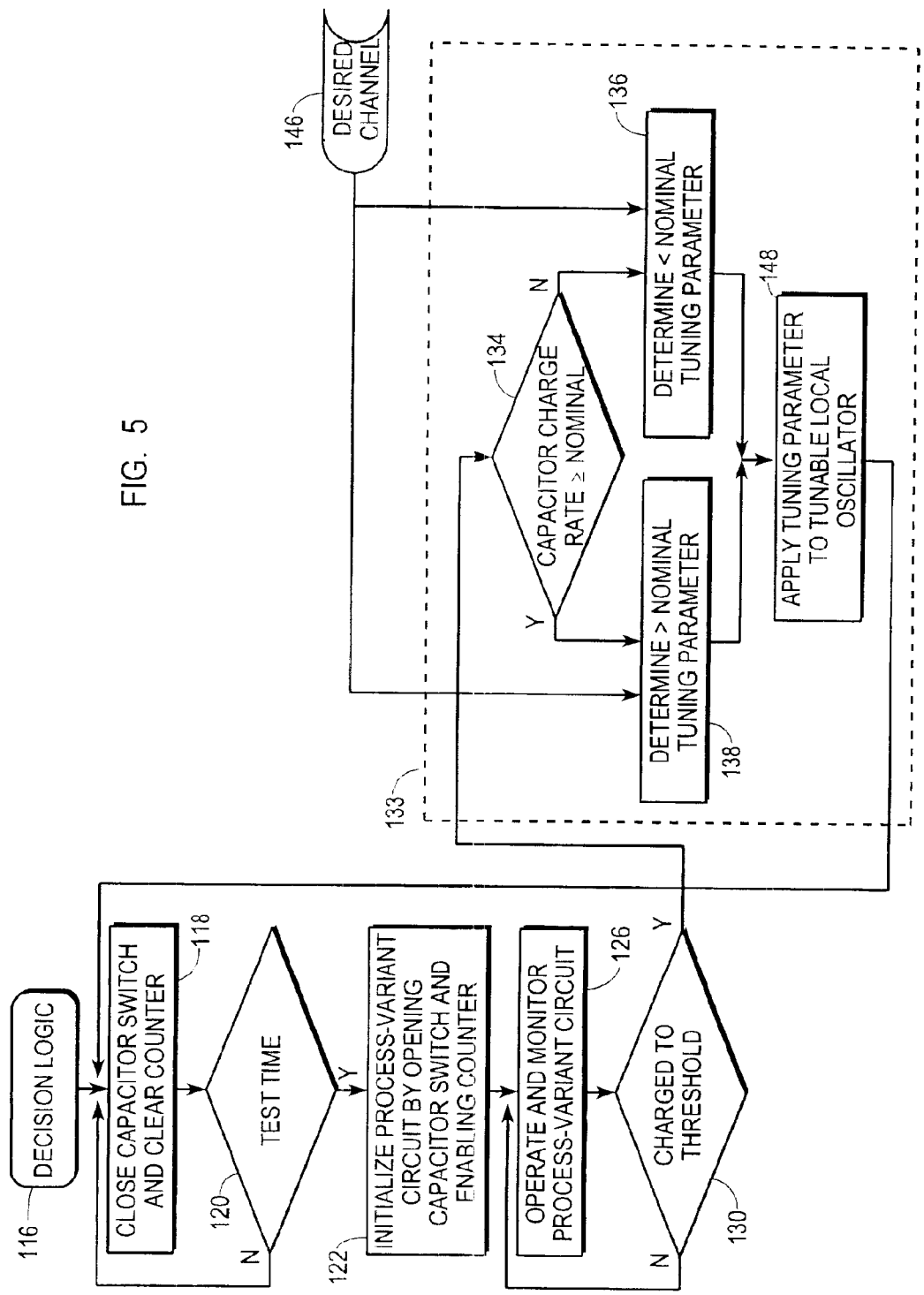
FIG. 5 shows a flow chart depicting one exemplary process performed by a decision logic portion of the control circuit of FIG. 4.

FIG. 5 shows a flow chart depicting an exemplary decision logic process 116 performed by decision logic circuit 112 (FIG. 4). Those skilled in the art will appreciate that the precise nature of process 116 is not a critical parameter of the present invention and that decision logic circuit 112 may be implemented in a variety of ways, including discrete logic, a state machine, microcontroller, and the like.

Figure 6:
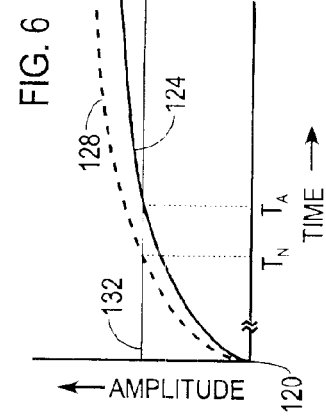
FIG. 6 shows a timing diagram depicting actual and nominal charge rates of a test capacitor included in the process-variant circuit depicted in FIG. 4.

FIG. 6 shows a timing diagram depicting actual and nominal charge rates of test capacitor 104 included in process-variant circuit 80.

Referring to FIGS. 4–6, process 116 includes a task 118 in which control signal 86 from decision logic circuit 112 is activated to close switching device 106, clear counter 110, and hold capacitor switch 106 and counter 110 in their closed and cleared states. After continuing this state for a period of time, test capacitor 104 discharges. Consequently, the voltage across test capacitor 104 is approximately zero, as indicated at point 120 in FIG. 6. Following task 118, a query task 120 determines whether it is time to perform a test to estimate the actual center frequency $F_{CA}$ for IF filter 44 (FIGS. 1–2). Such tests are desirably performed upon initial activation and then simply from time to time thereafter at a sufficient repetition rate to track changes that might occur due to temperature changes. In order to minimize power consumption and the generation of unwanted noise, infrequent testing is desirable. For example, such tests might be performed once every 1–300 seconds. When task 120 determines not to conduct a test, program control loops back to task 118.

When task 120 identifies an instant when a test should begin, a task 122 initializes process-variant circuit 80 by opening capacitor switch 106 and removing any clear signal to enable counter 110. At this instant, test capacitor 104 begins charging, and the voltage present across test capacitor 104 and the negative input of comparator 98 follows track 124 depicted by a solid line in FIG. 6. Process 116 performs a task 126 during this time to operate and monitor process-variant circuit 80.

Track 124 depicts an actual charge rate for test capacitor 104. The actual charge rate is different from a nominal charge rate 128, depicted as a dotted line in FIG. 6. The nominal charge rate represents the designed charge rate which should be achieved if test resistor 102 and test capacitor 104 actually exhibit their specified values. However, actual resistive and capacitive values seldom equal their nominal values due to the same process and temperature variations that have and are influencing the center frequency of IF filter 44. Accordingly, when the actual center frequency $F_{CA}$ of IF filter 44 is lower than the nominal frequency $F_{CN}$ of IF filter 44, the charge rate of test capacitor 104 is lower than its nominal charge rate by a corresponding amount, and vice-versa.

In conjunction with task 126, a query task 130 determines whether test capacitor 104 has charged to its 1.00 V threshold 132 (FIG. 6). Task 130 may monitor test signal 88 in making its determination. So long as the threshold has not yet been reached, program control loops back to task 126 to continue operating and monitoring process-variant circuit 80.

When task 130 determines that test capacitor 104 has charged to its 1.00 V threshold 132, process 116 performs a sub-process 133 to estimate the actual center frequency $F_{CA}$ of IF filter 44. In particular, a query task 134 evaluates the count output of counter 110. At this point, test signal 88 has disabled counter 110 to freeze the count. Task 134 determines whether the actual charge rate of test capacitor 104 is greater or less than the nominal charge rate. A less than nominal charge rate is indicated by a lower than nominal count while a greater than nominal charge rate is indicated by a greater than nominal count. For a less than nominal charge rate, process 116 performs a task 136, and for a greater than nominal charge rate process 116 performs a task 138. Task 136 determines a less than nominal tuning parameter and task 138 determines a greater than nominal tuning parameter.

Figure 7:
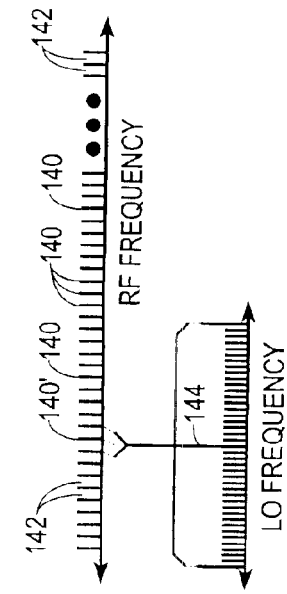
FIG. 7 shows a frequency diagram of a portion of the electromagnetic spectrum in which the RF receiver depicted in FIG. 1 may operate.

FIG. 7 shows a frequency diagram of a portion of the electromagnetic spectrum in which receiver 22 (FIG. 1) may operate. As depicted in a top trace in FIG. 7, receiver 22 may be tuned to any of a diverse number of frequency channels. Frequency channels 140 are spaced a minimum predetermined frequency difference 142 apart. Different frequency channels require the tuning of tunable local oscillator 90 (FIG. 1) to different local oscillator frequencies. For an IF filter 44 where its actual center frequency FA equals its nominal center frequency $F_{CN}$, local oscillator 90 would be tuned so that local oscillator signal 94 (FIG. 1) would exhibit a nominal frequency 144 offset from the frequency of a desired frequency channel 140' by 2 MHz in the preferred embodiment. However, as discussed above, in the preferred embodiment actual center frequency $F_{CA}$ will seldom equal nominal center frequency $F_{CN}$.

Tasks 136 and 138 may first identify the nominal tuning parameter to be applied to tunable local oscillator 90 to achieve the nominal local oscillation frequency for an identified desired frequency channel 140'. The identify of a desired frequency channel 140' may come from a data source 146 external to control circuit 78. In one frequency hopping embodiment of the present invention, baseband data received at and demodulated by receiver 22 specify such channels and the instants in time where such tuning should take place. However, the precise manner in which such frequency channel identities becomes known to tasks 136 and 138 is not important to the present invention. Task 138 may then alter the nominal tuning parameter for a higher local oscillation frequency and task 136 may alter the nominal tuning parameter for a lower local oscillation frequency. In the preferred embodiment, the degree of alteration is proportional to the amount by which the actual charge rate 124 of test capacitor 104 differs from its nominal charge rate 128.

After task 136 or 138 determines the tuning parameter that causes tunable local oscillation signal 94 to oscillate at a frequency to cause downconversion mixer 40 to produce IF signal 42 at a frequency approximately equal to the actual center frequency FA of IF filter 44, process 116 progresses to a task 148. During task 148 the tuning parameter is applied to local oscillator 90. In order to generate an appropriately precise local oscillation frequency, decision logic circuit 112 and tunable local oscillator 90 are desirably configured with a sufficient number of bits of resolution so that the frequency of local oscillation signal 94 is adjustable in steps smaller than difference 142 between frequency channels 140. More preferably, decision logic circuit 112 and tunable local oscillator 90 are desirably configured so that such steps are less than 10% of difference 142, and are around 5% of difference 142 in the preferred embodiment.

Accordingly, the actual center frequency $F_{CA}$ of IF filter 44 is estimated through sub-process 133. In the preferred embodiment, the actual center frequency $F_{CA}$ is determined indirectly and characterized as the tuning parameter that makes tunable local oscillator 90 generate local oscillator signal 94 at the frequency which, when mixed with a desired RF channel 140' produces an IF signal 42 at the actual center frequency FCA of IF filter 44.

After task 148, program control loops back to task 118 to repeat process 116. By repeating process 116, receiver 22 tracks changes in the actual center frequency $F_{CA}$ of IF filter 44.

In summary, the present invention provides an improved communications receiver having an integrated IF filter along with a method for operating a communications receiver having an integrated IF filter. Low power and a small chip die area are used by an RF receiver that has a non-tunable, on-chip IF filter. A small number of low power circuits are needed to operate a process-variant circuit that shadows the on-chip IF filter to estimate an actual center frequency for the IF filter. Then, a tunable local oscillator is controlled so that after downconversion an IF signal approximately equals the actual center frequency of the IF filter.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A radio-frequency receiver having an integrated circuit IF filter, said radio-frequency receiver comprising:

a semiconductor substrate;

a downconversion mixer having an input and an output;

a tunable local oscillator coupled to said mixer input;

an intermediate frequency filter having an input coupled to said mixer output, said intermediate frequency filter being formed on said semiconductor substrate using a resistor-forming semiconductor process;

a process-variant circuit having an input and an output, said process-variant circuit being formed on said semiconductor substrate using said resistor-forming semiconductor process; and a control circuit having an output and an input coupled to said process-variant circuit input and output, respectively, and having an output coupled to said tunable local oscillator, said control circuit being configured to initialize said process-variant circuit, then monitor performance of said process-variant circuit and determine a tuning parameter for said tunable local oscillator based upon said performance of said process-variant circuit.

2. A radio-frequency receiver as claimed in claim 1 wherein said control circuit and said tunable local oscillator are mutually configured so that said tuning parameter causes said tunable local oscillator to generate a local oscillator signal oscillating at a frequency that causes said downconversion mixer to produce an IF signal oscillating at a frequency approximately equal to a center frequency of said intermediate frequency filter.

3. A radio-frequency receiver as claimed in claim 1 wherein:

said radio-frequency receiver additionally comprises a process-invariant circuit configured to generate a reference signal substantially unaffected by variations in said resistor-forming semiconductor process; and said control circuit is further configured to monitor said reference signal so that said tuning parameter for said tunable local oscillator is also based upon said reference signal.

4. A radio-frequency receiver as claimed in claim 1 wherein said process-invariant circuit comprises a crystal oscillator.

5. A radio-frequency receiver as claimed in claim 1 wherein said process-invariant circuit comprises a bandgap-referenced DC voltage source formed on said substrate.

6. A radio-frequency receiver as claimed in claim 1 wherein:

said intermediate frequency filter is formed on said semiconductor substrate using a capacitor-forming semiconductor process; and said process-variant circuit is formed on said semiconductor substrate using said capacitor-forming semiconductor process.

7. A radio-frequency receiver as claimed in claim 1 wherein said process-variant circuit comprises:

a capacitor; and a resistor coupled to said capacitor so that a charge rate of said capacitor after said process-variant circuit is initialized by said control circuit is responsive to an actual resistance value exhibited by said resistor as a result of said resistance-forming semiconductor processes.

8. A radio-frequency receiver as claimed in claim 7 wherein: said tunable local oscillator is configured so that said radio-frequency receiver receives signals in a plurality of diverse frequency channels;

said process-variant circuit generates a test signal which is responsive to said charge rate of said capacitor; and said control circuit configures said tuning parameter for a lower than nominal local oscillator frequency when said test signal indicates a charge rate less than a predetermined nominal charge rate of said capacitor.

9. A radio-frequency receiver as claimed in claim 1 wherein said intermediate frequency filter comprises a plurality of filter capacitors and a plurality of filter resistors coupled together to form a bandpass filter.

10. A radio-frequency receiver as claimed in claim 1 wherein said intermediate frequency filter and said process-variant circuit are located proximate one another on said semiconductor substrate.

11. A radio-frequency receiver as claimed in claim 1 wherein:

said tunable local oscillator is tuned so that said radio-frequency receiver receives signals in a plurality of diverse frequency channels spaced a predetermined frequency difference apart; and said tunable local oscillator is configured to be tunable in steps less than said predetermined frequency difference.

12. A radio-frequency receiver as claimed in claim 11 wherein said tunable local oscillator is configured to be tunable in steps of less than ten percent of said predetermined frequency difference.

13. A radio-frequency receiver as claimed in claim 1 wherein said downconversion mixer, said tunable local oscillator, and said control circuit are formed on said substrate.

14. A radio-frequency receiver as claimed in claim 1 wherein said intermediate frequency filter is a non-tunable filter.

15. A method of tuning to a desired frequency channel a radio-frequency receiver having a common semiconductor substrate on which an intermediate frequency filter and a process-variant test circuit are formed through the performance of a resistor-forming semiconductor process, said method comprising:

operating said process-variant test circuit to estimate an actual center frequency of said intermediate frequency filter and to generate a test signal by generating a reference signal from a process-invariant circuit, said process-invariant circuit being configured so that said reference signal is substantially unaffected by variations in said resistor-forming semiconductor process;

forming a tuning parameter in response to said estimated actual center frequency, said desired frequency channel, said test signal, and said reference signal; and applying said tuning parameter to a tunable local oscillator which generates a local oscillator signal that, when mixed in a downconversion mixer with an RF signal from said desired frequency channel, generates an IF signal exhibiting approximately said actual center frequency of said IF filter.

16. A method as claimed in claim 15 wherein:

said intermediate frequency filter comprises a plurality of filter capacitors and a plurality of filter resistors coupled together to form a bandpass filter having an actual center frequency different from a nominal center frequency of said intermediate frequency filter;

said process-variant circuit comprises a test capacitor coupled to a test resistor so that an actual charge rate of said test capacitor, which is different from a nominal charge rate of said test capacitor, is exhibited after initialization of said process-variant circuit;

said operating activity comprises generating said test signal to be responsive to said actual test capacitor charge rate; and said forming activity comprises identifying a nominal tuning parameter for said desired frequency channel, said nominal tuning parameter being associated with said nominal charge rate of said test capacitor, and adjusting said nominal tuning parameter in response to said test signal.

17. A method as claimed in claim 16 wherein said forming activity forms a lower than nominal tuning parameter when said test signal indicates an actual test capacitor charge rate less than said nominal test capacitor charge rate.

18. A method of operating an integrated radio-frequency receiver comprising:

activating an intermediate frequency filter and a process-variant circuit, said intermediate frequency filter and said process-variant circuit being formed on a common semiconductor substrate using a common resistor-forming semiconductor process;

activating a control circuit, a tunable local oscillator, and a downconversion mixer;

initializing said process-variant circuit from said control circuit;

monitoring performance of said process-variant circuit in said control circuit;

determining a tuning parameter for said tunable local oscillator in response to said monitoring activity; and applying said tuning parameter to said tunable local oscillator so that said local oscillator generates a local oscillator signal oscillating at a frequency which causes said downconversion mixer to generate an IF signal exhibiting a frequency approximately equal to a center frequency of said intermediate frequency filter.

* * * * *